(12) United States Patent
Cai

(10) Patent No.: US 10,910,472 B2
(45) Date of Patent: Feb. 2, 2021

(54) INTEGRATED CIRCUIT, LDMOS WITH BOTTOM GATE AND BALLAST DRIFT

(71) Applicant: TEXAS INSTRUMENTS INCORPORATED, Dallas, TX (US)

(72) Inventor: Jun Cai, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/729,824

(22) Filed: Dec. 30, 2019

(65) Prior Publication Data

US 2020/0135860 A1 Apr. 30, 2020

Related U.S. Application Data

(62) Division of application No. 15/682,128, filed on Aug. 21, 2017, now Pat. No. 10,529,804.

(51) Int. Cl.
*H01L 29/08* (2006.01)
*H01L 29/78* (2006.01)
(Continued)

(52) U.S. Cl.
CPC ........ *H01L 29/0869* (2013.01); *H01L 21/761* (2013.01); *H01L 29/063* (2013.01); *H01L 29/0878* (2013.01); *H01L 29/1095* (2013.01); *H01L 29/66598* (2013.01); *H01L 29/66659* (2013.01); *H01L 29/66681* (2013.01); *H01L 29/66689* (2013.01); *H01L 29/7816* (2013.01); *H01L 29/7835* (2013.01); *H01L 29/0653* (2013.01); *H01L 29/1083* (2013.01)

(58) Field of Classification Search
None
See application file for complete search history.

(56) References Cited

U.S. PATENT DOCUMENTS 6,531,355 B2   3/2003  Mosher et al.
8,247,869 B2   6/2012  Yang et al.
(Continued)

OTHER PUBLICATIONS

Kumar et al. "Extended-p+ Stepped Gate LDMOS for Improved Performance", IEEE Transaction on Electronic Devices, vol. 57, No. 7, Jul. 2010, 6 pages.
(Continued)

*Primary Examiner* — Xiaoming Liu
(74) *Attorney, Agent, or Firm* — Andrew R. Ralston; Charles A. Brill; Frank D. Cimino

(57) ABSTRACT

Disclosed examples include LDMOS transistors and integrated circuits with a gate, a body region implanted in the substrate to provide a channel region under a portion of the gate, a source adjacent the channel region, a drain laterally spaced from a first side of the gate, a drift region including a first highly doped drift region portion, a low doped gap drift region above the first highly doped drift region portion, and a second highly doped region portion above the gap drift region, and an isolation structure extending through the second highly doped region portion into the gap drift region portion, with a first end proximate the drain region and a second end under the gate dielectric layer, where the body region includes a tapered side laterally spaced from the second end of the isolation structure to define a trapezoidal JFET region.

31 Claims, 9 Drawing Sheets

(51) Int. Cl.
*H01L 29/06* (2006.01)
*H01L 29/10* (2006.01)
*H01L 29/66* (2006.01)
*H01L 21/761* (2006.01)

(56) References Cited

U.S. PATENT DOCUMENTS

| | | |
|---|---|---|
| 8,324,042 B2 | 12/2012 | Cai |
| 8,390,057 B1 | 3/2013 | Zuniga et al. |
| 8,530,296 B2 | 9/2013 | Hao et al. |
| 2004/0201061 A1 | 10/2004 | Jeon et al. |
| 2009/0267144 A1 | 10/2009 | Kobayashi et al. |
| 2010/0258867 A1* | 10/2010 | Lee .............. H01L 29/66681 257/339 |
| 2012/0299093 A1 | 11/2012 | Kim |
| 2015/0255596 A1* | 9/2015 | Cai .............. H01L 29/7816 257/337 |
| 2015/0279969 A1 | 10/2015 | Levy et al. |
| 2016/0043217 A1* | 2/2016 | Cai .............. H01L 21/76224 257/337 |
| 2016/0093612 A1 | 3/2016 | Zhang et al. |
| 2016/0365412 A1 | 12/2016 | Cai |
| 2017/0162690 A1 | 6/2017 | Edwards et al. |

OTHER PUBLICATIONS

Jeong et al. "Development of Low-Vgs N-LDMOS Structure with Double Gate Oxide for Improving Rsp", Transactions on Electrical and Electronic Materials, vol. 10, No. 6, Dec. 25, 2009, 3 pages.
PCT Search Report for Application No. PCT/US 2018/047102, dated Nov. 29, 2018.

* cited by examiner

INTEGRATED CIRCUIT, LDMOS WITH BOTTOM GATE AND BALLAST DRIFT

CROSS-REFERENCE TO RELATED APPLICATIONS

This application is a continuation of U.S. patent application Ser. No. 15/682,128, filed Aug. 21, 2017, issued as U.S. Pat. No. 10,529,804, the content of which is herein incorporated by reference in its entirety.

BACKGROUND

High speed digital logic circuits include transistors formed with thin gate oxide layers designed for high speed operation at low supply voltages. Many integrated circuits include digital logic circuits as well as interface circuitry designed to operate at higher voltages. Power BiCMOS circuit fabrication processes combine bipolar and complementary metal oxide semiconductor (CMOS) technologies to support low voltage, high speed digital logic circuits as well as higher voltage transistors to implement digital and analog input/output (IO) interface circuits, power management switches or the like. Certain approaches use laterally diffused MOS (LDMOS) or drain-extended MOS (DeMOS) transistors with drain structures capable of operating at higher voltages as compared to conventional symmetric MOS transistors. LDMOS transistors include a lightly doped lateral diffused drain region between the heavily doped drain contact and the transistor channel to conduct lateral current and form a depletion region to create a voltage drop between the drain contact and the transistor gate. The reduced drain voltage at the channel allows use of a thin gate oxide and a low gate voltage transistor can be used as a switch for high drain voltage applications. However, extending the lateral drift region to accommodate higher voltages increases the triode region on-state resistance RDSON and increases the device size, device cost and specific resistance Rsp. The specific resistance Rsp is the drain-to-source on-state resistance of the transistor in a given amount of area, and can be expressed as Rsp=RDSON*Area. In addition, the factor Q for transistor switching loss is related to the device input, output and reverse transfer capacitances, and low gate charge Qg, related to gate capacitance, and switching loss are important for high frequency operation. Split or stepped poly gates can be used to minimize main gate area for a reduced Qg, but this is only beneficial for a relatively high voltage rated device or a relatively long drift length. This approach also increases device size and cost and generally provides no significant device Rsp reduction. Moreover, addition of split gate structures over an extended drain increases the output or drain capacitance. Conventional LDMOS designs do not provide a complete solution for short channel devices with small pitch size for high voltage applications to reduce the specific resistance and still support efficient high frequency operation with low RDSON and Q.

SUMMARY

Disclosed examples include integrated circuits (ICs) and LDMOS transistors, with a gate structure, a tapered body region implanted in a substrate to provide a channel region under a portion of the gate, a source region adjacent the channel region and a drain region laterally spaced from a first side of the gate structure in the substrate. The LDMOS further includes a drift region that extends over a buried layer region in the substrate. The drift region includes a first highly doped drift region portion above the buried layer region, a low doped gap drift region above the first highly doped drift region portion, and a second highly doped region portion above the gap drift region. The LDMOS also includes an isolation structure that extends downward through the second highly doped region portion and into the gap drift region portion, with a first end contacting the drain region, and a second end under the gate dielectric layer. In certain examples, the body region includes a tapered side that is laterally spaced from the second end of the isolation structure by a first lateral distance at the top surface of the substrate to provide a channel region under a portion of the gate dielectric layer. The tapered side is laterally spaced from the second end of the isolation structure by a smaller second lateral distance in the gap drift region portion to define a JFET region with a wide top in the second n-drift region portion below the gate dielectric layer, and a narrow bottom in the gap drift region portion. The JFET region provides a voltage controlled bottom gate to control the electric field distribution between the JFET region and a ballast drift portion of the first highly doped drift region portion under the isolation structure.

DETAILED DESCRIPTION

Figure 1:
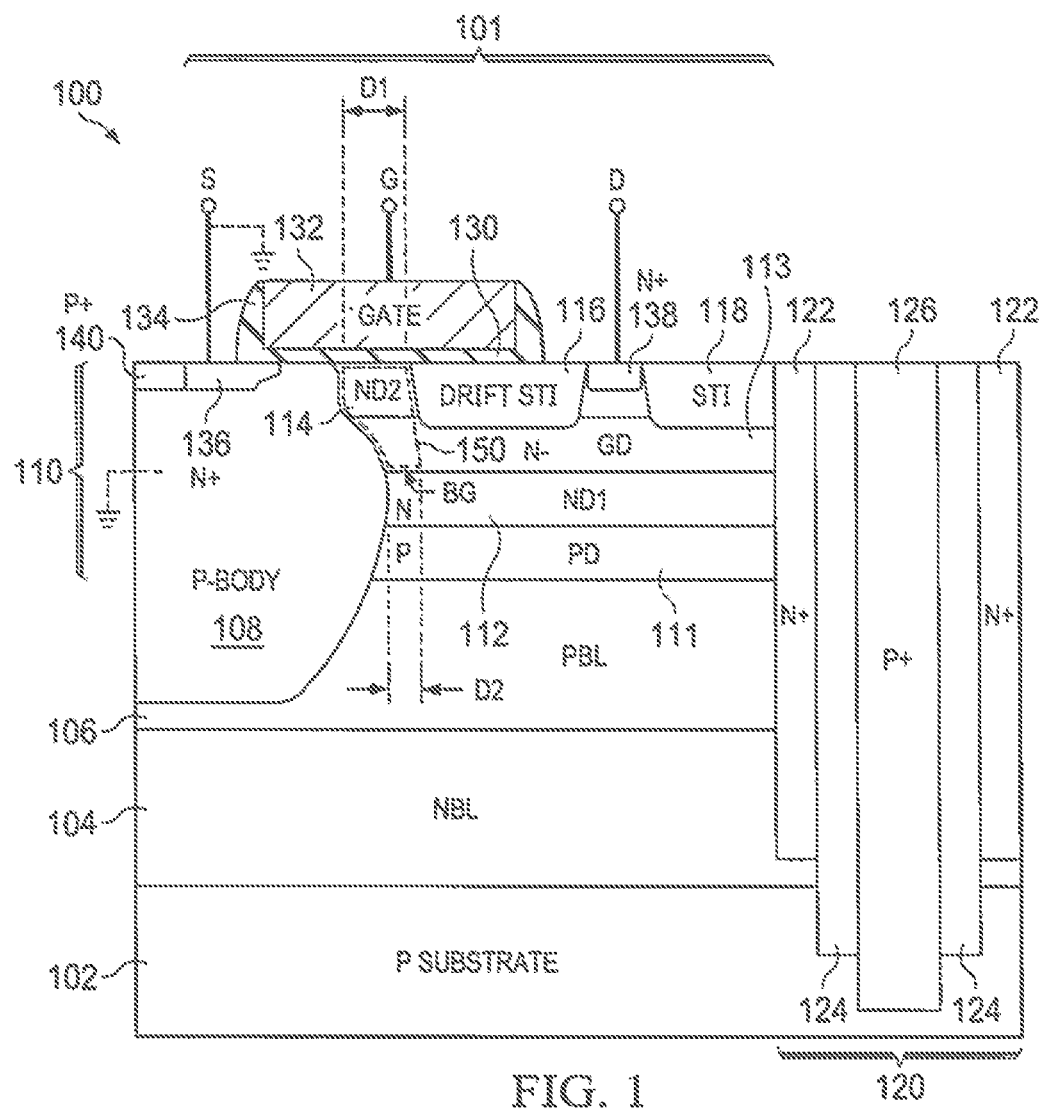
FIG. 1 shows a partial sectional side elevation view of an integrated circuit including an LDMOS transistor with a polygonal JFET region.

FIG. 1 shows a partial view of an integrated circuit (IC) 100 with an LDMOS transistor 101 fabricated from a semiconductor substrate 102. In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". The illustrated example is an n-channel LDMOS with a JFET region. Other implementations are possible within the scope of the present disclosure, including p-channel LDMOS examples using oppositely doped structures and regions. In one example, the substrate 102 is a p-doped silicon substrate or wafer, with various buried layers 104, 106 and a drift region 110 formed therein. In another possible implementation, the substrate includes one or more epitaxial silicon layers (not shown) formed on a top surface, with one or more of the buried layers 102, 104, 106 and the drift region 110 formed in epitaxial layers of the substrate.

The n-channel LDMOS 101 in FIG. 1 includes an n-type buried layer (NBL) region 104 implanted in the substrate 102 using n-type dopants (e.g., phosphorus and/or As). A p-type buried layer (PBL) region 106 is formed by implanting p-type dopants (e.g., Boron) above the NBL region 104 in the substrate 102. The drift region 110 extends above the PBL region 106 in the substrate 102. The drift region 110 includes a first n-drift region portion 112 (labeled ND1 in the drawing) that extends above the PBL region 106. The drift region 110 also includes a gap drift region 113 (labeled GD) including low or lightly doped n-type impurities (e.g., phosphorus) that provide a lightly doped n-type buffer region above the first n-drift region portion 112. In one example, the substrate 102 is initially p-type silicon including boron or other p-type dopants, and the gap drift region portion 113 is counter doped with phosphorus or other n-type dopants to provide the lightly doped n-type region portion 113. In certain examples, the light n-type doping of the gap drift region portion 113 is created by diffused tail areas from the n-type dopants implanted into the n-drift region portions 112 and/or 114. The gap drift region portion 113 in one example has a dopant concentration that is less than the n-type dopant concentrations of the first and second n-drift region portions 112 and 114. The drift region 110 further includes a second n-drift region portion 114 (labeled ND2) that extends above the gap drift region 113 to the upper or top surface of the substrate 102.

The LDMOS transistor example 101 in FIG. 1 also includes a gate structure with a gate dielectric layer 130 formed over a top or upper surface of the substrate 102, a gate electrode structure 132 on the gate dielectric layer 130, and lateral sidewall spacers 134. A p-type body region 108 is implanted in the substrate 102, for example, using boron or other p-type dopants. The p-body region 108 provides a channel region under a portion of the gate dielectric layer 130 with a channel width shown in the upper surface of p-body as a first lateral distance D1. A heavily doped n-type drain region 138 (labeled N+) is formed in the upper surface of the substrate 102. The drain region 138 is laterally spaced from a first side of the gate structure, and a heavily doped n-type source region 136 is adjacent the channel region in the substrate 102 proximate and partially under the second side of the gate structure. The illustrated example also includes a P+ implanted region 140 adjacent to and laterally outward of the source region 136.

An isolation structure 116 (labeled STI in FIG. 1) extends partially under the gate structure and includes oxide material to define an extended drain structure. In one example, the isolation structure 116 is an oxide formed in a shallow trench using shallow trench isolation (STI) fabrication techniques. In another example, local oxidation of silicon (LOCOS) or other suitable isolation processing techniques and materials are used to form the isolation structure 116. A first end of the isolation structure 116 contacts the drain region 138, and a second end extends under the gate dielectric layer 130. The isolation structure 116 extends downward through the second highly doped region portion 114 and into the gap drift region portion 113. The drift region structure 110 provides a ballast drift portion of the gap drift region portion 113 between the isolation structure 116 and the PBL region 106.

The illustrated IC 100 further includes a second isolation structure (STI) 118 disposed laterally outward of the drain region 138, which also extends through the second highly doped region portion 114 and into the gap drift region portion 113. The second isolation structure 118 is adjacent a deep trench isolation structure 120, that includes implanted N+ doped sidewall structures 122 that extend from the top surface of the substrate 102 through the drift region 110 and the PBL region 106, and into the NBL region 104. In certain examples, the deep trench isolation structure 120 is formed as a ring structure to surround the LDMOS transistor 101. The sidewall structures 122 are formed on opposite lateral sides of field oxide structures 124 that extend into the p substrate 102. The field oxide structures 124 laterally surround a P+ silicon structure 126 that extends from the upper surface into the p substrate 102 below the NBL region 104.

The IC 100 further includes contact structures (not shown) to provide electrical connection to one or more features of the transistor 101, along with a metallization structure (not shown) covering the transistor 101 and providing external electrical interconnection to the transistor source, drain and gate terminals, respectively designated S, D and G in FIG. 1. The metallization structure can include a pre-metal dielectric (PMD) material formed over the illustrated structure, with contact structures formed therein to provide electrical interconnection access for further upper metallization layers (not shown).

In certain examples, the drift region 110 further includes a p-drift region portion 111 (labeled PD) between the PBL region 106 and the first n-drift region portion 112. When included, the p-drift region portion 111 controls the electric field distribution between the ballast drift portion of the gap drift region portion 113 under the isolation structure 116 and the PBL region 106. In certain implementations, the dopant concentration of the p-drift region portion 111 can be different for LDMOS transistors designed to operate at different drain voltages.

In certain examples, the illustrated structure in FIG. 1 can be replicated (e.g., to the left in FIG. 1) in symmetrical fashion about a central source structure 136 and a single p-body region 108, with another gate structure 130, 132, 134 and further laterally outward isolation and drain structures 116 and 138, where the parallel gate structures are electrically interconnected to one another, and the parallel drain structures 138 are electrically interconnected to one another, with the symmetrical structure operating as a single LDMOS transistor 101. Other symmetrical implementations are possible, for example, with symmetrical parallel sets of gate structures and source structures on both lateral sides of a single central drain structure 138. As mentioned above, moreover, while the illustrated LDMOS transistor example 101 in FIG. 1 is an n-channel device, p-channel LDMOS transistors are possible having oppositely doped structures and regions in other implementations of the presently disclosed concepts.

The example n-channel the LDMOS transistor 101 advantageously provides a short channel extended drain device without using stepped or split gate structures, while allowing high-voltage operation that can be tailored for transistors operating at different voltage levels using a single gate oxide thickness in the IC 100. Moreover, the illustrated IC structure 100 can be fabricated without adding significant process cost, and without adding a significant number of masks to a CMOS or BiCMOS fabrication process. The LDMOS transistor 101 includes a JFET structure 150 (shown in dashed line in FIG. 1) created by the tapered structure of the p-body region 108 and the isolation structure 116. In the illustrated example, the p-body region 108 includes a tapered side that extends downward and laterally inward in the gap drift region portion 113 toward the drain (i.e., to the right in FIG. 1). The tapered P-body region side is laterally spaced from the second end of the isolation structure 116 by the first lateral distance D1 at the top surface of the substrate 102 to provide the channel region in the upper surface of p-body, upper region of JFET under a portion of the gate dielectric layer 130. In addition, the tapered side of the p-body region 108 is laterally spaced from the second end of the isolation structure 116 by a smaller second lateral distance D2 in the gap drift region portion 113.

The tapered side of the p-body region 108 and the second end of the isolation structure 116 define a JFET region 150 having a generally polygonal cross section with a wide top and a narrow bottom gate designated BG in FIG. 1. The JFET region 150 includes a wide top in the second n-drift region portion 114 below the gate dielectric layer 130. The narrow bottom in the gap drift region portion 113 provides a voltage controlled bottom gate BG to control the electric field distribution between the JFET region 150 and a ballast drift portion of the first n-drift region portion 112 under the isolation structure 116. The JFET region 150 provides controlled depletion in the narrow gap between the p-body region 106 and the lower STI structure corner for controlled pinch-off during the LDMOS off state to prevent excessive voltage at the gate dielectric layer 130. This facilitates use of a single thin gate dielectric layer 130 for both low voltage transistors (not shown) and the LDMOS transistor 101 in the IC 100.

Referring now to FIGS. 2 and 3-9, FIG. 2 shows a method 200 to fabricate an n-channel LDMOS transistor, and FIGS. 3-9 illustrate processing of the integrated circuit 100 at various intermediate stages of fabrication to produce the LDMOS transistor of FIG. 1 according to the method 200. In other examples, P-channel LDMOS transistors can be fabricated according to the method 200 using opposite dopant implantation steps and materials. A starting substrate is provided at 202. In one example, a p-doped silicon wafer substrate is provided at 202, such as the substrate 102 in FIG. 3. In another example, a silicon on insulator (SOI) starting wafer is used. A substrate of a different semiconductor material can be provided at 202 in other implementations. In one example, an epitaxial layer (not shown) is formed on the substrate 102 using an epitaxial growth deposition process at 204, and the LDMOS transistor 101 is formed in the epitaxial layer of the substrate 102. In other implementations, the epitaxial layer and the processing at 204 are omitted. At 206, n-type dopants (e.g., phosphorus) are implanted into the substrate 102 to form NBL region in the substrate 102 (e.g., NBL region 104 in FIG. 3). A PBL region (e.g., region 106) is formed at 208 by implanting p-type dopants (e.g., boron) into the substrate 102 above the NBL region 104.

Figure 2:
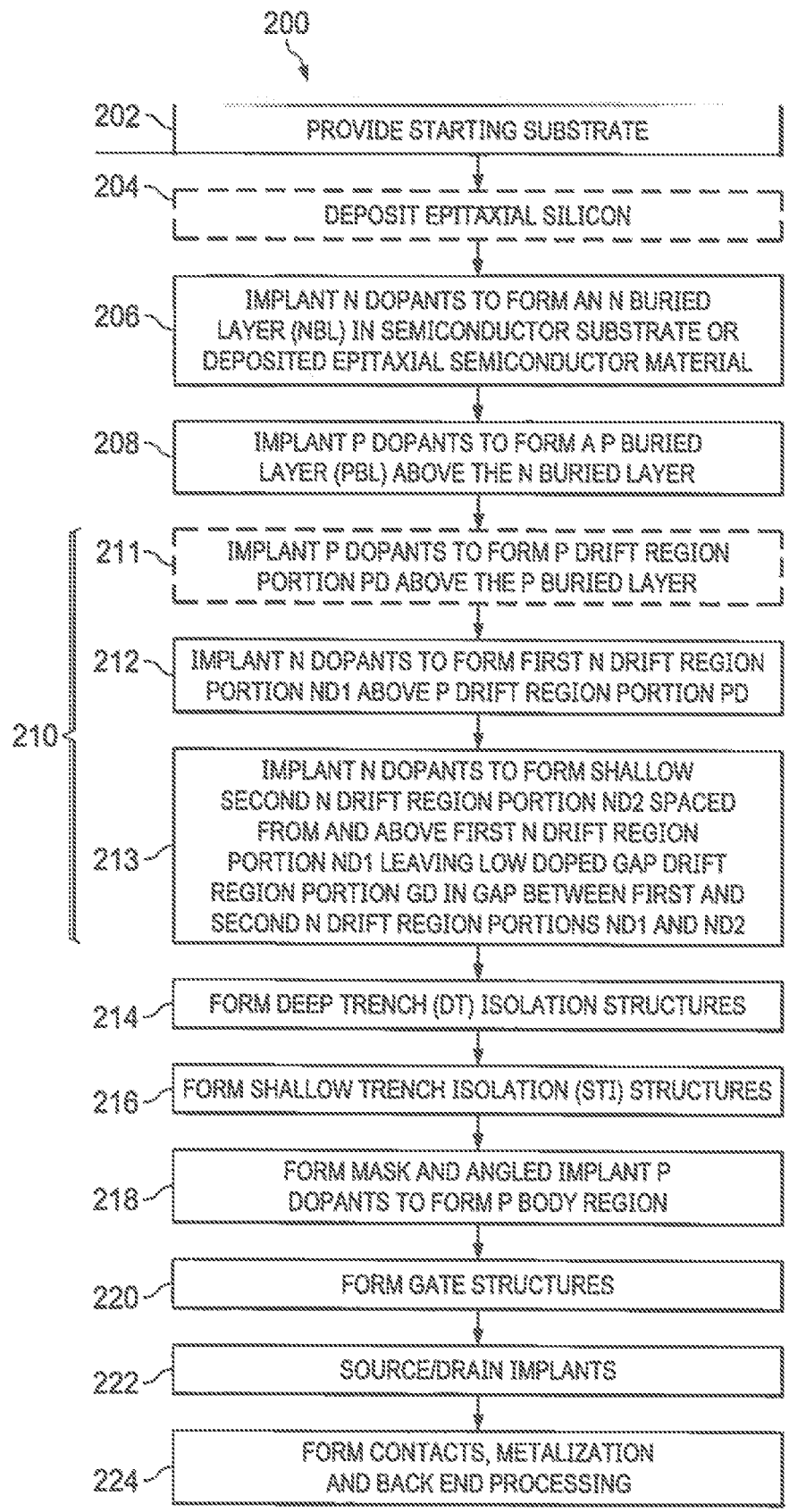
FIG. 2 is a flow diagram showing a method for making an LDMOS transistor.
Figure 3:
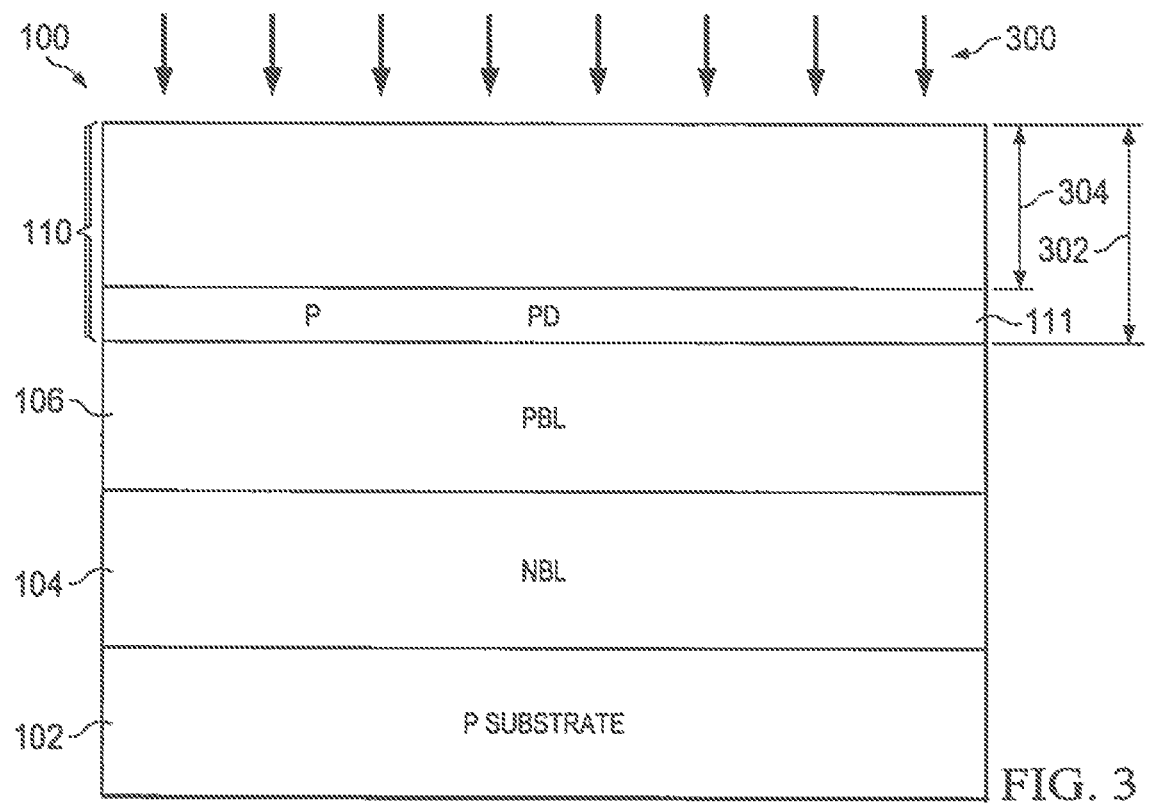
FIGS. 3-9 are partial sectional side elevation views of the integrated circuit at different stages of fabrication to provide the LDMOS transistor of FIG. 1.
Figure 4:
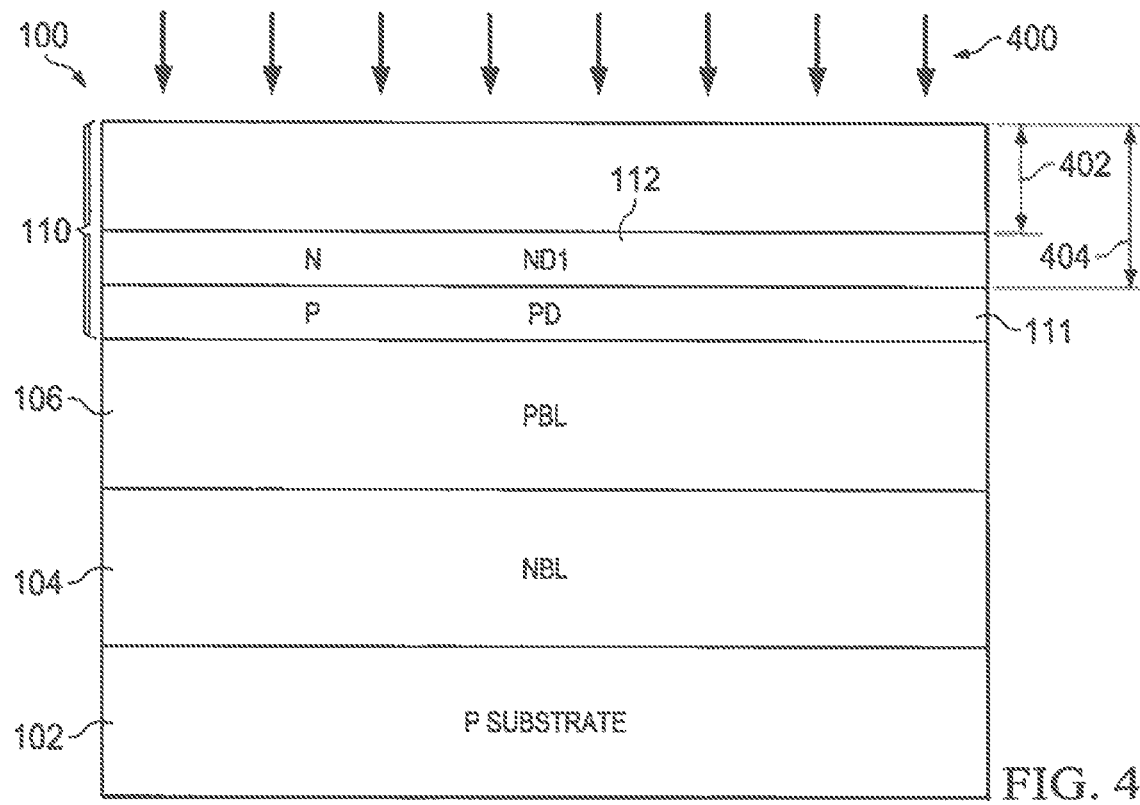
Figure 5:
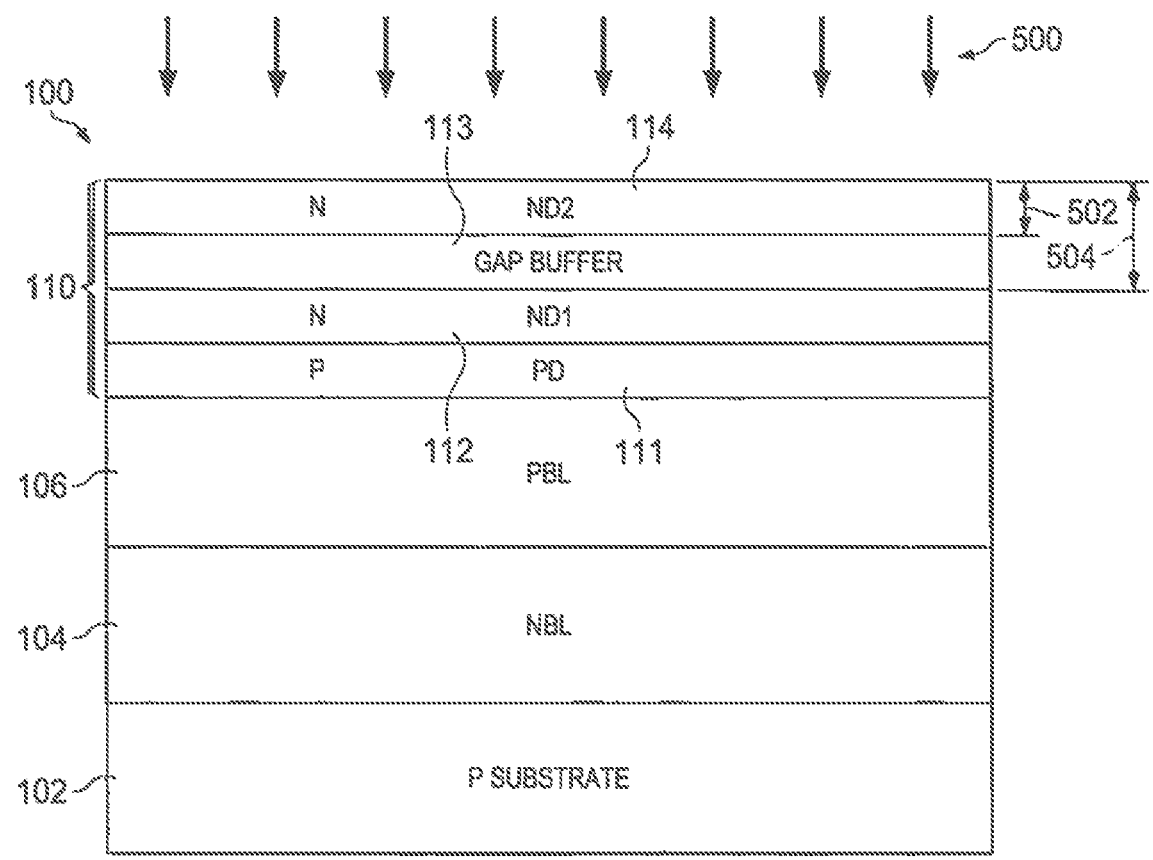

A drift region 110 is formed above the PBL region 106 at 110 in FIG. 2, as shown in FIGS. 3-5. In one example, a p-drift region portion (111 in FIG. 3) is formed above the PBL region 106 at 211 in FIG. 2 by implanting p-type dopants into the substrate 102 between a first depth 302 (e.g., 1.6 µm) and a second depth 304 (e.g., 1.2 µm) using an implantation process 300 in FIG. 3. In other implementations, the implant at 211 can be omitted. As shown in FIG. 4, n-type dopants are implanted into the substrate 102 at 212 in FIG. 2 using an implantation process 400 in FIG. 4 to form the first n-drift region portion 112 above the PBL region 106 (and above any included p-drift region 111). The implantation at 212 forms the first (e.g., deep) n-drift region portion 112 between a depth 402 (e.g., 0.5 µm) and a second depth 404 (e.g., 1.2 µm) shown in FIG. 4. In certain examples, the second depth 404 in FIG. 4 is the same as the second depth 304 in FIG. 3, although not a strict requirement of all possible implementations. In the example of FIG. 4, the lower depth 404 of the first n-drift region portion 112 extends to the p-drift region portion 111, and is above and spaced from the PBL region 106. In other implementations, the first n-drift region portion 112 is implanted to the depth of the PBL region 106, for example, where no p-drift region portion 111 is implanted.

As further shown in FIG. 5, an implantation process 500 is used at 213 in FIG. 2 to implant n-type dopants into the substrate 102 to form the second (e.g., shallow) n-drift region portion 114 to a depth 502 (e.g., zero depth at the upper surface of the substrate 102) and a second depth 504 (e.g., 0.25 µm). The implantation at 213 forms the region portion 114 above and spaced from the first n-drift region portion 112 and leaves or defines a low doped gap drift region portion 113 between the n-drift region portions 112 and 114 (e.g., between the depths 502 and 504 in FIG. 5). In one example, the portion 113 is lightly n-doped due to diffused tail areas from the more highly doped n-drift region portions 112 and 114.

Figure 6:
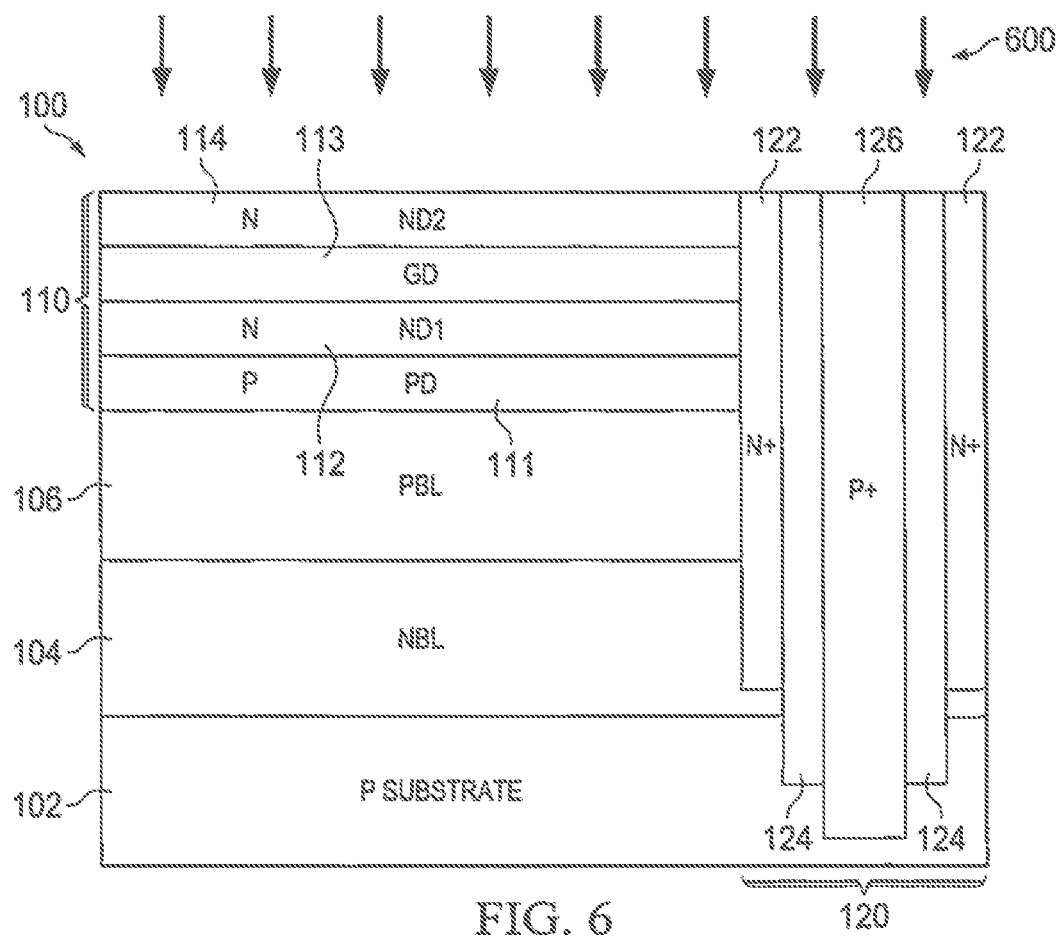

The illustrated method 200 in one example includes forming the deep trench isolation structure 120 at 214 in FIG. 2 using a process 600 in FIG. 6. Any suitable deep trench processing techniques can be used. In one example, a trench is etched through the drift region 110, the PBL region 106 and the NBL region 104 and into the portion of the p substrate 102. An N+ implantation is performed to dope the trench sidewall structures 122 to a depth into the NBL region 104, and the sidewalls are oxidized to form the field oxide structures 124. A silicon deposition process with in-situ P+ doping to form the structure 126 between the oxide structures 124, leaving the deep trench isolation structure 120 shown in FIG. 6.

Figure 7:
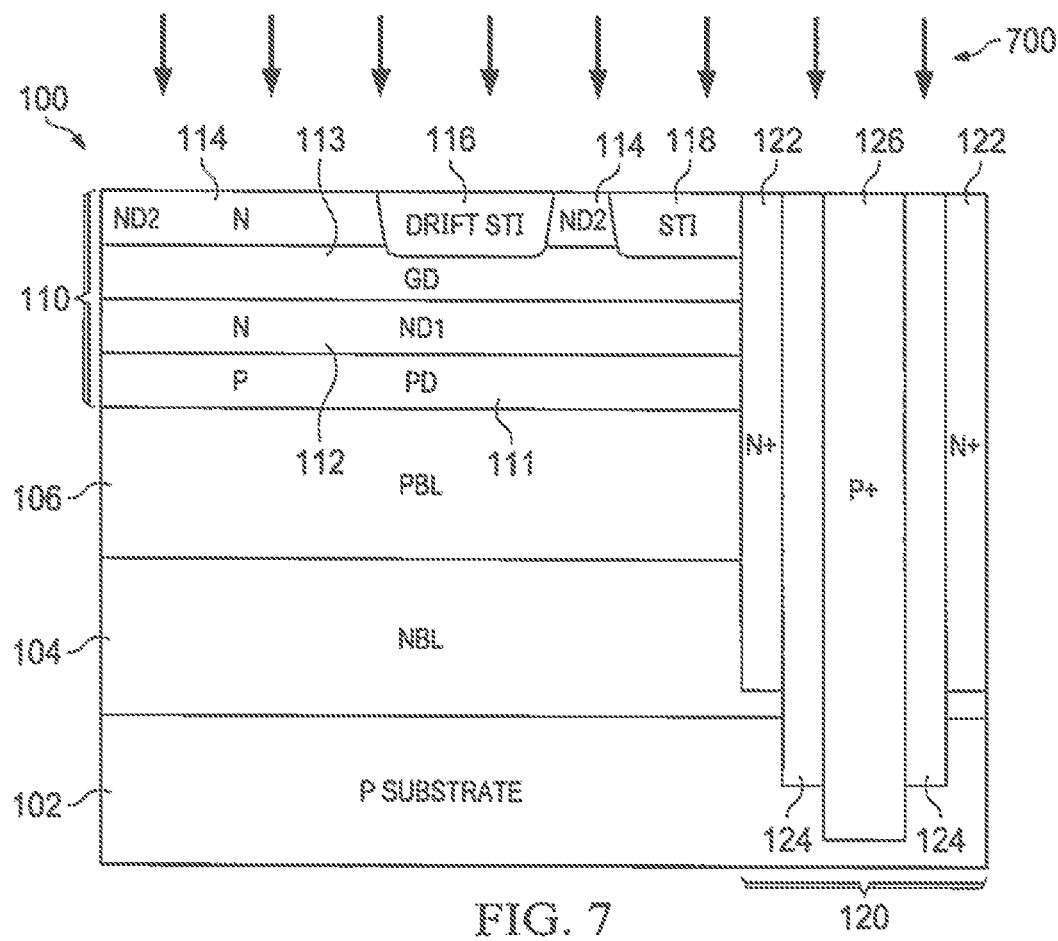

The process 200 continues at 216 in FIG. 2 with a shallow trench isolation process 700 in FIG. 7 to form the isolation structure 116 (labeled DRIFT STI in FIG. 7) that extends downward through the second n-drift region portion 114 and into the gap drift region portion 113. The isolation structure 116 includes a first end proximate a prospective drain region, and a second end under a prospective gate region. The second isolation structure 118 is formed laterally outward of the prospective drain region using the process 700 at 216. In one example, trenches are etched and filled with oxide to form the structures 116 and 118. Other processes can be used, such as LOCOS processing at 216 to form the isolation structures 116 and 118. In one example, the STI isolation structure 116 in FIG. 1 extends downward into the substrate structure to a depth of approximately 0.35 µm, and the isolation structure 116 may, but need not, have an upper surface that is generally coplanar with the upper surface of the substrate 102.

Figure 8:
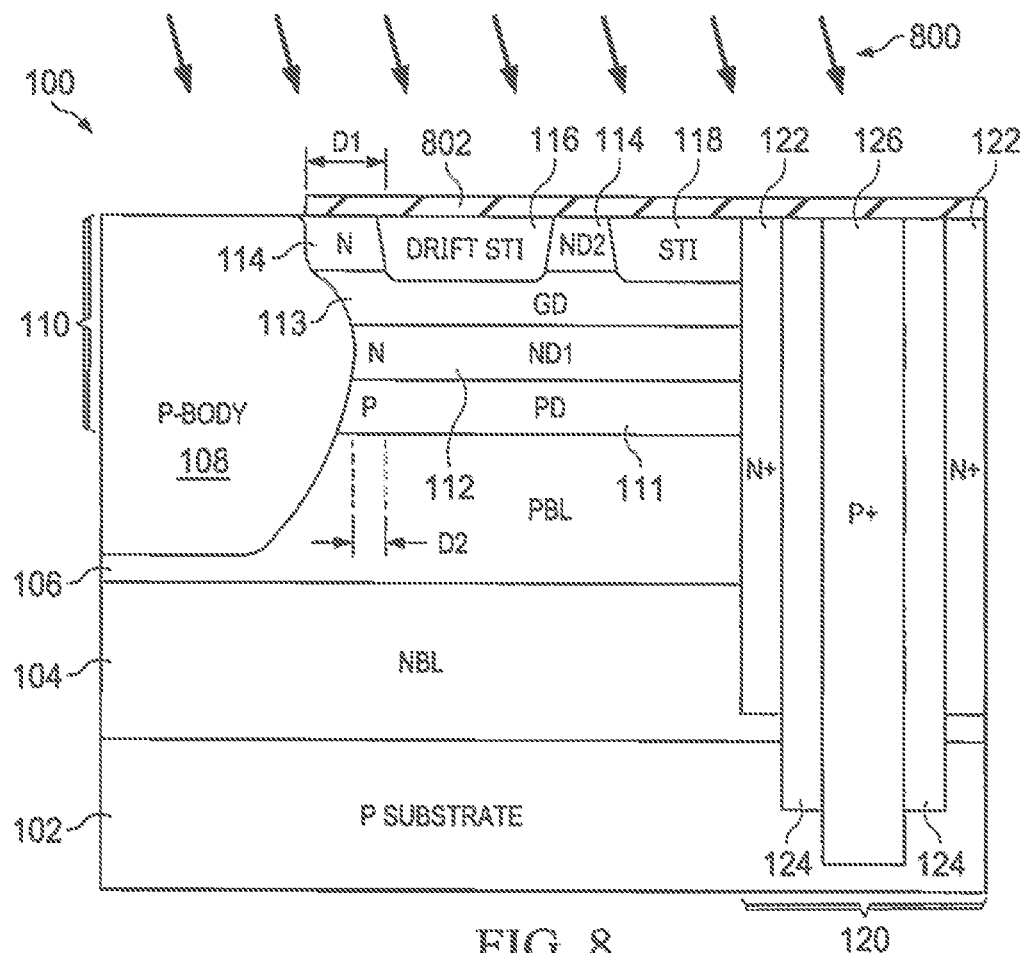

At 218 in FIG. 2, a mask 802 is formed and p-type dopants are implanted into the substrate 102 using an implant process 800 as shown in FIG. 8. The masked implant at 218 forms the p-body region 108 that extends through the drift region 110 and into the PBL region 106, and provides the narrow channel region at the top or upper surface of the substrate 102. In one example, the implantation is performed at 218 using an angled implantation process 800 to preferentially diffuse implanted p-type dopants (e.g., boron) laterally toward the isolation structure (i.e., to the right in FIG. 8) to create a tapered side of the p-body 108. A short channel is formed in the narrow upper surface of the p-body when a gate dielectric layer over the area. This creates a generally JFET region form that is wide on the top and narrower on the bottom. The resulting tapered side of the implanted p-body region 108 is laterally spaced from the second end of the isolation structure 116 by the larger lateral channel width distance D1 at the top surface of the substrate 102, and is laterally spaced from the isolation structure 116 by the smaller distance D2 in the gap drift region portion 113.

Figure 9:
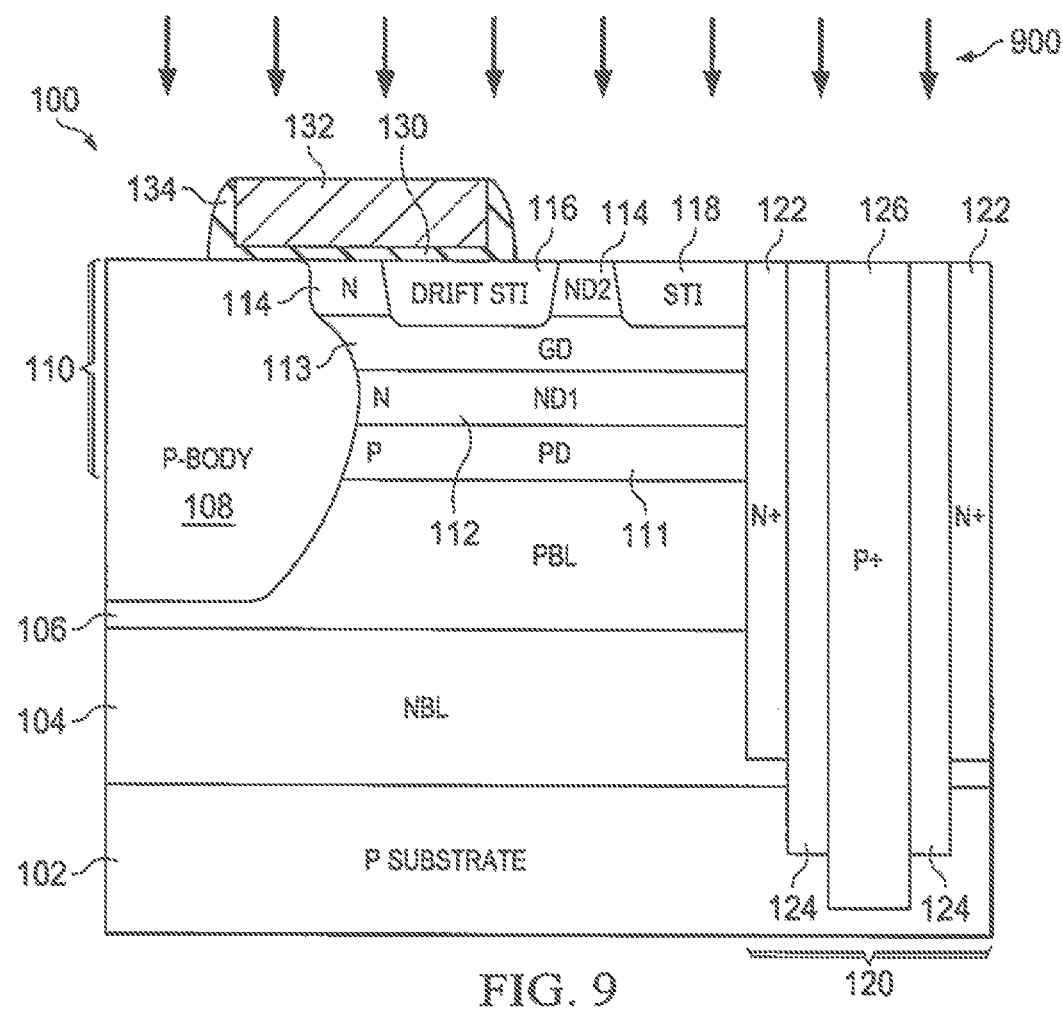

At 214 in FIG. 2, the gate structure 130, 132, 134 is formed using any suitable gate fabrication processing 900 as shown in FIG. 9. The gate dielectric layer 130 extends over the channel region, JFET and a portion of the isolation structure 116 to form a short channel compact gate configuration to control the prospective LDMOS transistor. The N+ source and drain regions 136 and 138 and any included P+ region 140 are formed at 222 using suitable implantation processing to provide the n-channel LDMOS structure 101 as described above in connection with FIG. 1. The processing at 222 in one example includes implanting n-type dopants into the substrate 102 to form the n-type source region 136 adjacent the channel region in the p-body region 108 and to form the n-type drain region 138 adjacent the first end of the isolation structure 116 in the second n-drift region portion 114. Further processing is performed at 224 to forms contacts, metallization structures and to complete other back end processes to finish the integrated circuit 100.

Figure 10:
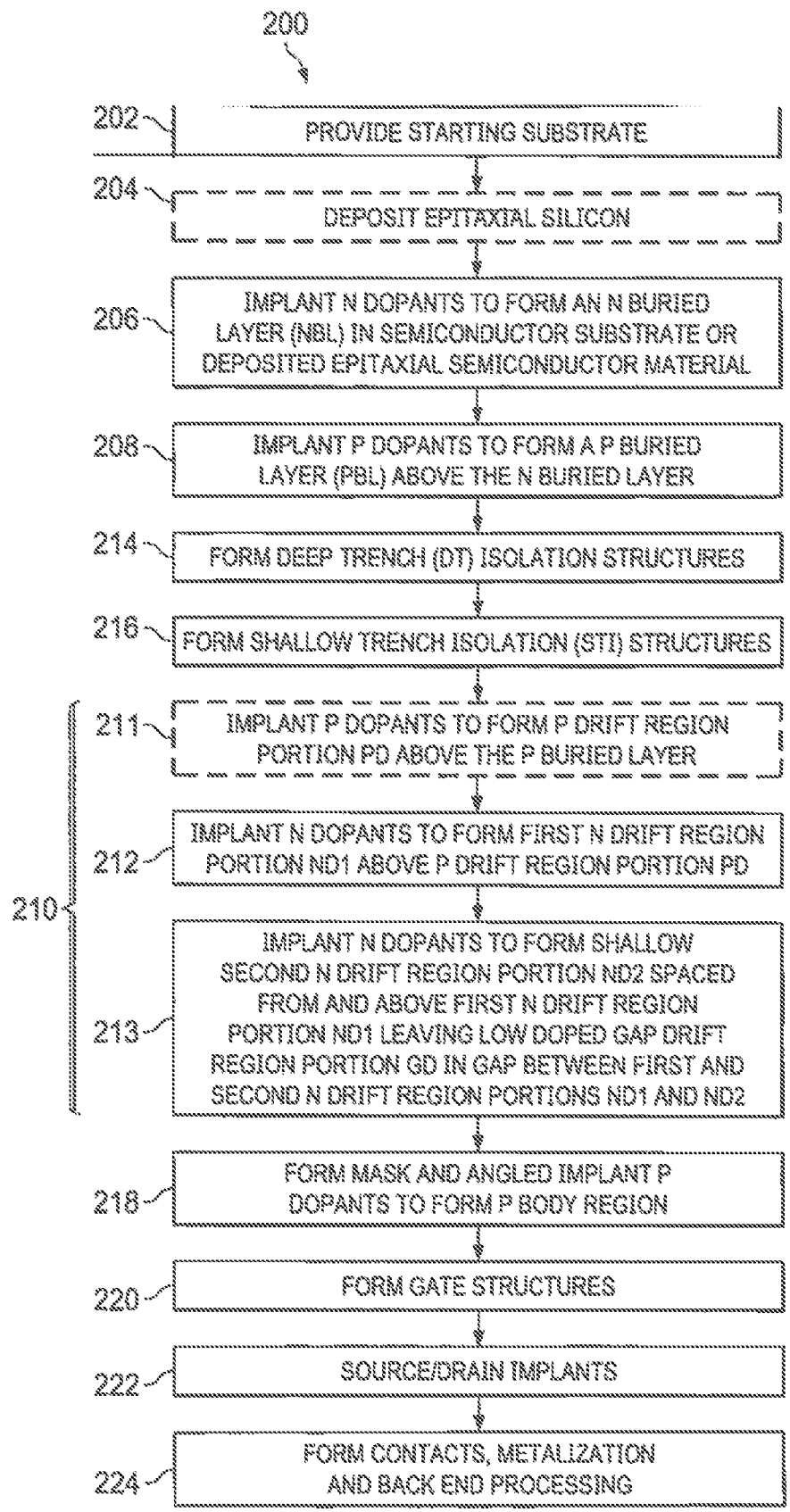
FIG. 10 is a flow diagram showing an alternate method for making an LDMOS transistor.

Referring also to FIG. 10, another non-limiting alternate implementation of the method 200 is illustrated. The illustrated process 200 of FIG. 2 involves forming the first and second n-drift region portions 112, 114 before forming the isolation structure 116. In the alternate implementation of FIG. 10, the first and second n-drift region portions 112, 114 are formed after forming the isolation structure 116. In this example, the processing at 202-208 is as described above in connection with FIG. 2, including forming an NBL region 104 at 206 and forming a PBL region 106 at 208. A p-drift region portion 111 is optionally performed at 211, and the first n-drift region portion 112 is formed at 212. In the example of FIG. 10, the trench isolation structures are formed at 214 and STI or other isolation structures are formed at 216 as described above. At 210 in FIG. 10, the p-drift region portion 111 is optionally formed at 211, and the first n-drift region portion 112 and the shallow second n-drift region portion 114 are formed at 212 and 213 by implantation after the isolation structures are formed at 216. At 218-224, the p-body region 108 is formed, along with the gate structures, source/drain regions and final contact and metallization structures as previously described.

Certain described examples include short channel LDMOS transistors 101 with a JFET region 150, a bottom gate BG, and a ballast drift region including the first n-type drift region portion 112. The LDMOS transistor 101 implements a JFET region 150 with a bottom gate BG and ballast drift concepts with the benefits of a short channel design and low on-state resistance and low switching loss (e.g., low RDSON*Q). The disclosed LDMOS transistors 101 provide an improved solution compared with split or stepped gate approaches, while facilitating use of a single thin gate dielectric layer for integrated circuits 100 that include both low voltage CMOS logic transistors and LDMOS devices for higher voltage operation. In this regard, the presently disclosed concepts can be used to provide short channel LDMOS transistor 101 at a small pitch size for high voltage applications in addition, the drift layer structure 110 and tapered p-body region 108 can be fabricated with a minimal number of implant masks and processing steps to provide a solution to support low mask count and low Rsp/R*Q integrated LDMOS suitable for power switches in high-speed applications. For example, the LDMOS transistor 101 can be used as a high or low side switch in a buck or boost DC-DC converter operated at high switching frequencies, where the extended drain reduces the output capacitance and gate capacitance to facilitate high speed, low switching loss operation while allowing relatively high drain voltages.

In certain example implementations, the LDMOS structure 101 includes three implanted regions 104, 106 and 110 which can be formed via stacked blanket implants without extra masks to create a short channel region under a portion of the gate dielectric layer 130, the JFET region 150 (FIG. 1), and an enhanced ballast drift region in the first n-type drift region portion 112 beneath the STI isolation structure 116 that is fabricated in certain implementations by body chain implants with one body mask layer. The LDMOS example 101 in FIG. 1 is isolated to the substrate 102 by a deep trench isolation ring structure 120 at a deep trench (DT) mask layer. In certain fabrication process implementations, the LDMOS fabrication is compatible with existing process flows, wherein heavily doped n-type buried blanket implants are separated from the other two blanket implantation processing before an optional in-line epitaxial deposition process (e.g., prior to depositing the epitaxial silicon at 204 in FIGS. 2 and 10 above). Various implementations are also compatible with fabrication of other devices in an integrated circuit 100, for example, where the n-type drift chain implants or the n-type drift working with p-type buried chain implants (e.g., 206, 208 and/or 210 in FIGS. 2 and 10) can be processed by using one extra drift mask to mask other (e.g., non-LDMOS or non-LDMOS drain drift) regions. In one example, the implants at 210 are done with a separate mask that convers a prospective p-body region and non-LDMOS regions of the IC 100.

In the example of FIG. 1, the drift region 110 includes two n-type and one p-type chain implants in which the relatively high doped drift-shallow n-type region portion 114 can be implanted only in the device moat (non-STI) area (e.g., through subsequent implantation following formation of the isolation structure 116, as per FIG. 10 above). The resulting structure provides reduced JFET resistance and compensating interface charge for improved device hot carrier performance. The first (e.g., deeper) n-type drift region portion 112 works with the PBL region 106 and the bottom gate BG to provide a high doped ballast region underneath drift STI to enhance charge balance and device reduced surface field (RESURF) to support high voltage operation at a small pitch dimensions to reduce Rsp and output capacitance of the LDMOS drain. The PBL region 106 enhances charge balance for the N doped, low resistance lateral current flow path in the region 112. The gap region portion 113 provides a buffer located close to the bottom and low voltage sidewall of the STI isolation structure 116. The buffer is formed by overlap of the tail areas of the first and second (deep and shallow) n-drift region portions 112 and 114 and prevents early surface electric field (E-field) accumulation due to the highly doped narrow ballast at high drain voltage levels. The buffer doping profile can be adjusted in various examples by an extra blanket implant or such adjusted doping can be provided through existing drift chain implants without an extra mask.

The JFET region 150 is has a roughly polygonal cross-section with a wide-top to release the E-field proximate the surface to protect the potentially thin gate dielectric layer 130 used in the LDMOS 101 and in other lower voltage devices in the IC 100. The JFET region 150 provides a narrow bottom with a width D2, and operates as a voltage-control bottom gate BG to adjust the E-field distribution between ballast drift and the JFET 150 at target voltages, and the design can be tailored for a given target operating voltage level. In operation, the JFET 150 and bottom gate BG reduce surface E-field even at a narrow high-doped ballast drift at high drain voltage levels to facilitate low on-state resistance in the drift region at a small lateral distance or pitch (e.g., low specific resistance Rsp). The LDMOS 101 implements a short channel region for reduced channel resistance and low gate capacitance while mitigating surface short channel punch-through. In addition, and the short channel length reduces the gate capacitance and thus reduces switching loss related to the gate charge Qg, which is particularly advantageous at high operating frequencies or switching speeds. The design facilitates trade-off between the on state and off state performance, and allows limited JFET resistance only in the shallow/narrow bottom gate area BG, in combination with improved device hot carrier performance and reduced overall JFET resistance due to the released surface E-field, compensated interface, and a high doped drift-shallow region.

The voltage-controlled bottom gate BG adjusts or sets the E-field distribution between ballast drift region and the JFET region 150 at target voltages and the sizing of the bottom gate BG provides controlled depletion and region pitch-off. In a fully on condition, the JFET bottom gate operates with minimum deleted area at high-gate/low-drain voltages. In a quasi-off condition of the LDMOS 101, a maximum area is depleted at low-gate/high-drain voltages, and the JFET surface peak E-field (E-peak) is synchronized with a targeted design maximum operating voltage.

The disclosed short channel LDMOS transistors 101 with a JFET region 150, bottom gate BG and ballast drift region to provide low R*Q and associated benefits for power switching and other applications. In other examples, the trapezoid JFET, bottom gate and ballast drift in combination with a deep nwell and a deep trench isolation structure 120 can be used, and the PBL region 106 and/or the NBL region 104 can be omitted for example, to further reduce the number of masks and process costs. In this regard, the PBL 106 and the NBL 104 can be implemented with blanket implantations without extra mask layers. In other examples, a short channel LDMOS 101 can be implemented with JFET region 150, bottom gate BG in combination and ballast drift, working with low cost CMOS transistors (e.g., shared with LDMOS layers) in a single IC 100, and such designs can omit one more CMOS snwell layer for further mask count reduction. Certain examples, moreover, employ dedicated body chain implants as a base to link-up the device short channel, bottom gate and enhanced ballast drift together for better device performance. In one example, the p-body 108 can be formed (e.g., at 218 in FIGS. 2 and 10 above) using chain p-type implants, including a boron (B) implant at implant energy 300 keV to 2 MeV, related to a particular targeted rated platform voltage, with an implant dose $9E13$ $cm^{-2}$ to $2E12$ $cm^{-2}$. In certain examples, the p-body region is implanted at an angle 0-9 degrees to facilitate linking the device shallow-body, bottom gate and blanket p-type buried layer region 106.

In further examples, the LDMOS 101 is fabricated with a JFET region 150 made by dedicated shallow body co-implants stacked on the top of the p-body up/down body chain implants worked with side-wall of the STI isolation structure 116. In one example, the device short channel is formed by surface lateral diffusion between Boron and As of the shallow body co-implants for a targeted small gate channel length Lg and low gate charge Qg for low switching loss. A retrograded shallow body is made in one example by p-type Boron and n-type As co-implants, including a Boron (B) implant at implant energy 60 keV to 260 keV, and implant dose $5E14$ $cm^{-2}$ to $1E13$ $cm^{-2}$, with an implant angle of 7-35°, and an Arsenic (As) implant at an energy of 25 keV to 160 keV, implant dose $1E15$ $cm^{-2}$ to $3E13$ $cm^{-2}$, and an implant angle of 0-9°. The bottom gate area BG formed near the bottom corner of the STI isolation structure 116 in one example is generally aligned to the outermost extent of the p-body region 108/drift region junction to control the depletion region pitch-off at target control voltage levels. The spacing at the lowest doped area of the bottom gate BG from the silicon substrate upper surface in one example is from 0.25 μm to 0.6 μm, and the width D2 of the bottom gate BG is controlled from the space between the STI isolation structure sidewall to the gate poly edge on the source side in one example is from 0.35 μm to 1.5 μm, to target different rated device voltages.

In certain examples using the two n-type drift region portions 112 and 114, and the p-type drift region portion 111, the drift region 110 is formed using n-type/p-type chain implants, including an n-type Phosphorus (P) implant (e.g., at 212 and 213 in FIGS. 2 and 10) at an implant energy of 160 keV to 2 MeV with an implant dose $2E13$ $cm^{-2}$ to $1E12$ $cm^{-2}$ and an implant angle of 0-9°, in combination with a p-type Boron (B) implant (e.g., at 211 in FIGS. 2 and 10) at an implant energy of 600 keV to 2 MeV with an implant dose $2E13$ $cm^{-2}$ to $1E12$ $cm^{-2}$ and implant angle 0 degree to 9 degree for enhanced charge balance with the built in small ballast region underneath the drift STI isolation structure 116 to facilitate low device Rsp and low output capacitance Coss. In certain examples, the shallow n-type second drift region portion 114 is implanted on the top of the first n-type drift region portion 112 (e.g., with no gap region 113) after the STI isolation structure etch, and the region portion 114 is only located in non-STI areas. In this example, the implantation of the second drift region portion 114 is done by an n-type As or phosphorus or As with phosphorus implants at an implant energy of 25 keV to 500 keV with an total implant dose of $2E13$ $cm^{-2}$ to $1E12$ $cm^{-2}$, and an implant angle of 0-9 degrees to facilitate reduced JFET resistance and compensating interface charge with an improved device hot carrier performance. Extra lightly doped implant, p-type or n-type, are added in certain examples in the drift chain implants to adjust the bottom gate (buffer area) voltage sensitivity to gate/drain voltage, in which case the n-type/p-type implant is controlled at an implant dose of $2E11$ $cm^{-2}$ to $2E12$ $cm^{-2}$ with an implant projected depth range of 0.25 μm to 0.6 μm.

In certain examples, the short channel LDMOS 111 is fabricated inside an isolation boundary, such as the illustrated combination of the NBL region 104, the PBL region 106, and the ring shaped deep trench isolation structure 120. In certain examples, the isolation features include a heavily doped, isolated NBL tub region 104 implanted with thickness from 3 μm to 10 μm after any in-line epitaxial deposition processing, in combination with a surrounding deep N-type well structure and/or the illustrated deep trench N portions 122 of the ring shaped deep trench isolation structure 120. An adjusted p-type blanked buried implant can be added in certain examples, stacked with any included implantation for the p-type drift region portion 111, as needed, to reduce platform parasitic BJT concerns, for instance, at an implant energy of 800 keV to 2.5 MeV with an implant dose of $2E13$ $cm^{-2}$ to $5E11$ $cm^{-2}$ and an implant angle of 0-9 degrees. In certain examples, the NBL region 104 and the PBL region 106 work with the deep trench structure 120 or any included deep nwell (not shown) to isolate the LDMOS transistor 101 to the substrate 102 for device high-side and isolated applications.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An integrated circuit (IC), comprising:
   a semiconductor substrate;

an n-type buried layer (NBL) region in the substrate;
a p-type buried layer (PBL) region above the NBL region in the substrate;
a drift region over the PBL region in the substrate, the drift region including: a first n-drift region portion above the PBL region, a low doped gap drift region above the first n-drift region portion, and a second n-drift region portion above the gap drift region;
a gate structure, including a gate dielectric layer formed over a top surface of the substrate, and a gate electrode on the gate dielectric layer;
an n-type drain region laterally spaced from a first side of the gate structure in the second n-drift region portion;
an isolation structure extending downward through the second n-drift region portion and into the gap drift region portion, the isolation structure including a first end contacting the n-type drain region, and a second end under the gate dielectric layer;
a p-body region extending through the drift region and into the PBL region, the p-body region including a tapered side laterally spaced from the second end of the isolation structure by a first lateral distance at the top surface of the substrate, the tapered side laterally spaced from the second end of the isolation structure by a smaller second lateral distance in the gap drift region portion, and the lateral distance between the tapered side and the second end of the isolation structure having a minimum in the first n-drift region; and
an n-type source region adjacent the channel region in the p-body region and extending laterally outward from a second side of the gate structure in the p-body region.

2. The IC of claim 1, wherein the tapered side of the p-body region and the second end of the isolation structure define a JFET region including a wide top in the second n-drift region portion below the gate dielectric layer, and a narrow bottom in the gap drift region portion.

3. The IC of claim 2, wherein the low doped gap drift region portion is a lightly doped n-type region with a dopant concentration that is less than dopant concentrations of the first and second n-drift region portions.

4. The IC of claim 3, wherein the drift region further includes a p-drift region portion between the PBL region and the first n-drift region portion.

5. The IC of claim 1, wherein the low doped gap drift region portion is a lightly doped n-type region with a dopant concentration that is less than dopant concentrations of the first and second n-drift region portions.

6. The IC of claim 5, wherein the drift region further includes a p-drift region portion between the PBL region and the first n-drift region portion.

7. The IC of claim 1, wherein the drift region further includes a p-drift region portion between the PBL region and the first n-drift region portion.

8. The IC of claim 1, wherein the drift region is formed in an epitaxial layer of the substrate.

9. The IC of claim 1, wherein the drift region touches the p-body region and a deep trench isolation structure that extends from a surface of the substrate through the NBL.

10. The IC of claim 9, wherein the deep trench isolation structure includes a highly doped p-type central portion within a highly doped n-type outer portion.

11. A laterally diffused metal oxide semiconductor (LDMOS) transistor, comprising:
a gate structure, including a gate dielectric layer formed over a substrate, and a gate electrode on the gate dielectric layer;
a body region implanted in the substrate to provide a channel region under a portion of the gate dielectric layer;
a source region adjacent the channel region in the substrate;
a drain region laterally spaced from a first side of the gate structure in the substrate;
a drift region extending over a buried layer region in the substrate, the drift region including a first highly doped drift region portion above the buried layer region, a low doped gap drift region above the first highly doped drift region portion, and a second highly doped region portion above the gap drift region, the low doped gap drift region portion having a dopant concentration that is less than dopant concentrations of the first and second highly doped drift region portions; and
an isolation structure, including a first end contacting the drain region, and a second end under the gate dielectric layer, the isolation structure extending downward through the second highly doped region portion and into the gap drift region portion and having a minimum lateral distance to the body region in the first highly doped drift region portion.

12. The LDMOS transistor of claim 11, wherein the body region includes a tapered side laterally spaced from the second end of the isolation structure by a first lateral distance at the top surface of the substrate, the tapered side laterally spaced from the second end of the isolation structure by a smaller second lateral distance in the gap drift region portion to define a JFET region including a wide top in the second highly doped region portion below the gate dielectric layer, and a narrow bottom in the gap drift region portion to provide a voltage controlled bottom gate to control an electric field distribution between the JFET region and a ballast drift portion of the first highly doped drift region portion under the isolation structure.

13. The LDMOS transistor of claim 11, wherein the tapered side of the body region and the second end of the isolation structure define a JFET region including a wide top in the second n-drift region portion below the gate dielectric layer, and a narrow bottom in the gap drift region portion.

14. The LDMOS transistor of claim 13, wherein the low doped gap drift region portion is a lightly doped n-type region with a dopant concentration that is less than dopant concentrations of the first and second n-drift region portions.

15. The LDMOS transistor of claim 14, wherein the drift region further includes a p-drift region portion between the PBL region and the first n-drift region portion.

16. The LDMOS transistor of claim 11, wherein the low doped gap drift region portion is a lightly doped n-type region with a dopant concentration that is less than dopant concentrations of the first and second n-drift region portions.

17. The LDMOS transistor of claim 16, wherein the drift region further includes a p-drift region portion between the PBL region and the first n-drift region portion.

18. The LDMOS transistor of claim 11, wherein the drift region further includes a p-drift region portion between the PBL region and the first n-drift region portion.

19. The LDMOS transistor of claim 11, wherein the drift region is formed in an epitaxial layer of the substrate.

20. The LDMOS transistor of claim 11, wherein the drift region touches the body region and a deep trench isolation structure that extends from a surface of the substrate through the buried layer.

21. An integrated circuit (IC), comprising:
a first buried layer having a first conductivity type located over a semiconductor substrate;

a second buried layer having a second opposite conductivity type over the first buried layer;
a gate structure over the semiconductor substrate and including a gate dielectric;
a drift region over the second buried layer, the drift region including:
  a first drift layer of the first conductivity type;
  a second drift layer of the first conductivity type touching the gate dielectric; and
  a third drift layer of first conductivity type between the first and second drift layers and having a dopant concentration lower than the first and second drift layers;
a drain region of the first conductivity type laterally spaced apart from a first side of the gate structure in the second drift layer;
a source region of the first conductivity type located adjacent a second opposite side of the gate structure;
an isolation structure extending downward through the second drift layer and into the third drift layer, the isolation structure located partially under the gate structure and touching the drain region; and
a body region having the second conductivity type extending from the second side of the gate structure and into the second buried layer, the body region extending toward the drain region by a first lateral distance into the second drift layer, extending toward the drain region by a second lateral distance into the second buried layer, and extending toward the drain region by a third lateral distance into the first drift layer; the third lateral distance being greater than the first and second lateral distances and being a maximum lateral distance the body region extends toward the drain region.

22. The IC of claim 21, further comprising a fourth drift layer of the second conductivity type between the second buried layer and the first drift layer, wherein the body region extends toward the drain region by a fourth lateral distance into the fourth drift layer, the fourth lateral distance being less than the third lateral distance and greater than the second lateral distance.

23. The IC of claim 21, wherein the first conductivity type is N-type and the second conductivity type is P-type.

24. The IC of claim 21, wherein the first and third drift layers extend between and touch the body region and a heavily doped region of a deep trench isolation structure.

25. The IC of claim 24, further comprising a dielectric trench isolation structure between and touching the drain region and the heavily doped region.

26. An integrated circuit (IC), comprising:
a buried layer having a first conductivity type located over a semiconductor substrate;
a gate structure over the semiconductor substrate and including a gate dielectric;
a drift region between the buried layer and the gate dielectric, the drift region including:
  a first drift layer of a second opposite conductivity type;
  a second drift layer of the second conductivity type between the first drift layer and the gate dielectric; and
  a third drift layer of second conductivity type between the first and second drift layers and having a dopant concentration lower than that of the first and second drift layers;
a drain region of the second conductivity type laterally spaced apart from a first side of the gate structure in the second drift layer;
a source region of the second conductivity type located adjacent a second opposite side of the gate structure;
a body region having the first conductivity type extending from the second side of the gate structure and into the buried layer, wherein the body region:
  extends toward the drain region by a first lateral distance into the second drift layer;
  extends toward the drain region by a second lateral distance into the buried layer; and
  extends toward the drain region by a third lateral distance into the first drift layer, the third lateral distance being greater than the first and second lateral distances and being a maximum extension of the body region toward the drain region.

27. The IC of claim 26, further comprising a dielectric trench isolation structure between the body region and the drain region.

28. The IC of claim 26, further comprising a heavily doped deep trench region of the second conductivity type, the first and third drift layers extending between and touching the body region and the heavily doped region.

29. The IC of claim 28, further comprising a buried layer having the second conductivity type that extends from under the body region to and touching the heavily doped deep trench region.

30. The IC of claim 26, wherein the first conductivity type is P-type and the second conductivity type is N-type.

31. An integrated circuit (IC), comprising:
a first buried layer having a first conductivity type located over a semiconductor substrate;
a second buried layer having a second opposite conductivity type over the first buried layer;
a gate structure over the semiconductor substrate and including a gate dielectric;
a drift region over the second buried layer, the drift region including:
  a first drift layer of the first conductivity type;
  a second drift layer of the first conductivity type touching the gate dielectric;
  a third drift layer of first conductivity type between the first and second drift layers and having a dopant concentration lower than the first and second drift layers; and
  a fourth drift layer of the second conductivity type between the second buried layer and the first drift layer;
a drain region of the first conductivity type laterally spaced apart from a first side of the gate structure in the second drift layer;
a source region of the first conductivity type located adjacent a second opposite side of the gate structure;
an isolation structure extending downward through the second drift layer and into the third drift layer, the isolation structure located partially under the gate structure and touching the drain region; and
a body region having the second conductivity type extending from the second side of the gate structure and into the second buried layer, the body region extending toward the drain region by a first lateral distance into the second drift layer, extending toward the drain region by a second lateral distance into the second buried layer, extending toward the drain region by a third lateral distance into the first drift layer; the third lateral distance being greater than the first and second lateral distances, and extending toward the drain region by a fourth lateral distance into the fourth drift layer, the fourth lateral distance being less than the third lateral distance and greater than the second lateral distance.

\* \* \* \* \*